(12) United States Patent
Parris et al.

(10) Patent No.: US 7,528,015 B2
(45) Date of Patent: May 5, 2009

(54) TUNABLE ANTIFUSE ELEMENT AND METHOD OF MANUFACTURE

(75) Inventors: Patrice M. Parris, Phoenix, AZ (US); Weize Chen, Phoenix, AZ (US); John M. McKenna, Chandler, AZ (US); Jennifer H. Morrison, Chandler, AZ (US); Moaniss Zitouni, Gilbert, AZ (US); Richard J. De Souza, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/169,962

(22) Filed: Jun. 28, 2005

(65) Prior Publication Data

US 2006/0292755 A1  Dec. 28, 2006

(51) Int. Cl.
  H01L 21/82  (2006.01)
  H01L 21/44  (2006.01)
  H01L 21/31  (2006.01)
(52) U.S. Cl. .................. 438/131; 438/600; 438/770; 438/981; 257/E21.625
(58) Field of Classification Search ............. 438/131, 438/770, 981; 257/E21.625
See application file for complete search history.

(56) References Cited

U.S. PATENT DOCUMENTS

| | | | | |
|---|---|---|---|---|
| 4,016,588 A * | 4/1977 | Ohya et al. | ........... | 257/322 |
| 4,115,914 A * | 9/1978 | Harari | ........... | 438/157 |
| 4,521,796 A | 6/1985 | Rajkanan et al. | | |
| 4,672,409 A * | 6/1987 | Takei et al. | ........... | 257/298 |
| 5,215,934 A | 6/1993 | Tzeng | ........... | 438/264 |
| 5,352,618 A * | 10/1994 | Larsen et al. | ........... | 438/264 |
| 5,475,253 A | 12/1995 | Look et al. | | |
| 5,502,000 A | 3/1996 | Look et al. | | |
| 5,780,341 A * | 7/1998 | Ogura | ........... | 438/259 |
| 5,915,171 A | 6/1999 | Sheu | | |
| 6,096,580 A | 8/2000 | Iyer et al. | | |
| 6,130,469 A | 10/2000 | Bracchitta et al. | | |
| 6,207,588 B1 * | 3/2001 | Choi et al. | ........... | 438/773 |

(Continued)

OTHER PUBLICATIONS

Candelier et al., "One Time Programmable Drift Antifuse Cell Reliability," IEEE 38th Annual International Reliability Physics Symposium, San Jose, CA 2000, pp. 169-173.

(Continued)

Primary Examiner—Walter L Lindsay, Jr.
Assistant Examiner—Ron E Pompey
(74) Attorney, Agent, or Firm—Ingrassia, Fisher & Lorenz, P.C.

(57) ABSTRACT

A tunable antifuse element (102, 202, 204, 504, 952) and method of fabricating the tunable antifuse element, including a substrate material (101) having an active area (106) formed in a surface, a gate electrode (104) having at least a portion positioned above the active area (106), and a dielectric layer (110) disposed between the gate electrode (104) and the active area (106). The dielectric layer (110) including the fabrication of one of a tunable stepped structure (127). During operation, a voltage applied between the gate electrode (104) and the active area (106) creates a current path through the dielectric layer (110) and a rupture of the dielectric layer (110) in a plurality of rupture regions (130). The dielectric layer (110) is tunable by varying the stepped layer thicknesses and the geometry of the layer.

5 Claims, 5 Drawing Sheets

U.S. PATENT DOCUMENTS

| | | | |
|---|---|---|---|
| 6,281,558 B1 * | 8/2001 | Sayama et al. | 257/391 |
| 6,515,344 B1 | 2/2003 | Wollesen | |
| 6,531,410 B2 * | 3/2003 | Bertin et al. | 438/766 |
| 6,794,726 B2 | 9/2004 | Radens et al. | |
| 7,268,387 B2 | 9/2007 | Kurokawa et al. | |
| 2003/0109090 A1 | 6/2003 | Bertin et al. | |
| 2004/0156234 A1 * | 8/2004 | Peng et al. | 365/177 |
| 2004/0238916 A1 | 12/2004 | Trivedi | |
| 2004/0238917 A1 | 12/2004 | Trivedi | |
| 2005/0007855 A1 | 1/2005 | Lee et al. | |

OTHER PUBLICATIONS

International Search Report and Written Opinion for correlating PCT Patent Application No. PCT/US06/22278 dated Jul. 3, 2008.

Henley, W.B. et al., "Effects of Iron Contamination on Thin Oxide Breakdowns and Reliability Characteristics", Proc. Intl. Reliability Physics Symposium, pp. 22-27, 1993.

Li, F. et al, "Evaluation of SiO2 Antifuse in a 3D-OTP Memory", IEEE Trans. Dev. and Mat. Reliability, vol. 4, No. 3, pp. 416-421, Sep. 2004.

* cited by examiner

TUNABLE ANTIFUSE ELEMENT AND METHOD OF MANUFACTURE

TECHNICAL FIELD OF THE INVENTION

The present invention generally relates to semiconductor integrated circuit technology, and more particularly to tunable antifuse element structures, and a method of manufacturing tunable antifuse elements, in semiconductor devices.

BACKGROUND OF THE INVENTION

One-time programmable non-volatile memories (OTP) have been widely used in read only memory (ROM) integrated circuits for circuit trimming and can be realized using a circuit containing fuse or antifuse element structures. When a fuse element is utilized, the device is programmed by blowing fusible links at selected nodes to create an open circuit. The combination of blown and unblown links represents a digital bit pattern of ones and zeros signifying data that a user wishes to store in OTP. A high power is normally required (e.g. ~50 mA for a poly fuse link in a 0.25 um CMOS flow) to blow the link. In addition, a large area with supporting circuits is required as well as a large separation from adjacent circuits, including other fuse elements. If the resultant damage to the fuse is not extensive enough, the disconnected blown links may become reconnected during long-term operation of the links, resulting in a circuit malfunction and reliability issues.

When an antifuse element is utilized, the programming mechanism is opposite the process of causing an open circuit in the fuse structure to be formed. Instead, the antifuse element programming mechanism creates a short circuit or a low resistance path. The antifuse element can include an insulating dielectric layer, such as a gate oxide, between two conducting layers. The unprogrammed state of an antifuse element is an open circuit with intact dielectric. The programmed state is a shorting path at a damaged point or region, known as the rupture point or region, in the dielectric layer, such as a gate oxide, formed by applying a voltage higher than the dielectric rupture voltage. It is known that, as the insulating dielectric layer in complementary metal oxide semiconductor (CMOS) flows becomes thinner (below 50 Å), many NMOS or PMOS types of structures are useful as antifuses, because the gate oxide rupture voltage/current becomes lower with thinner oxides resulting in a smaller trim circuit. Furthermore, spontaneous healing of a ruptured insulating dielectric layer is very unlikely, resulting in improved device reliability if power is constrained.

In general, previous antifuse elements are characterized by: (1) a program voltage higher than a low voltage CMOS transistor operation voltage; (2) long programming time (the charge-to-breakdown (QBD) is a function of gate oxide thickness, area and defects); and (3) large post program resistance and variation due to random rupture locations in the gate oxide.

Accordingly, it would be desirable to provide an antifuse element, a method of forming an antifuse element, in which the rupture location is controlled and the local rupture electric fields are enhanced. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

In accordance with the present invention, there is provided a tunable antifuse element including a tunable dielectric layer whereby a rupture voltage is tunable, a method of forming the tunable antifuse element, and incorporation of the tunable antifuse element in a bit cell array. The rupture voltage can be controlled (or tuned) through the manipulation of stepped transition regions between areas of different dielectric layer thickness. The formation process of the different dielectric layers, the geometries of the areas of different thicknesses and the physical properties of the substrate on which it is formed can all be used to modify the properties of these transition regions. The figures included herein illustrate a tunable antifuse element built on a CMOS capacitor, however, it should be understood that the tunable antifuse element of the present invention can be built on an NMOS transistor, a PMOS transistor, or MOS capacitor.

Figure 1:
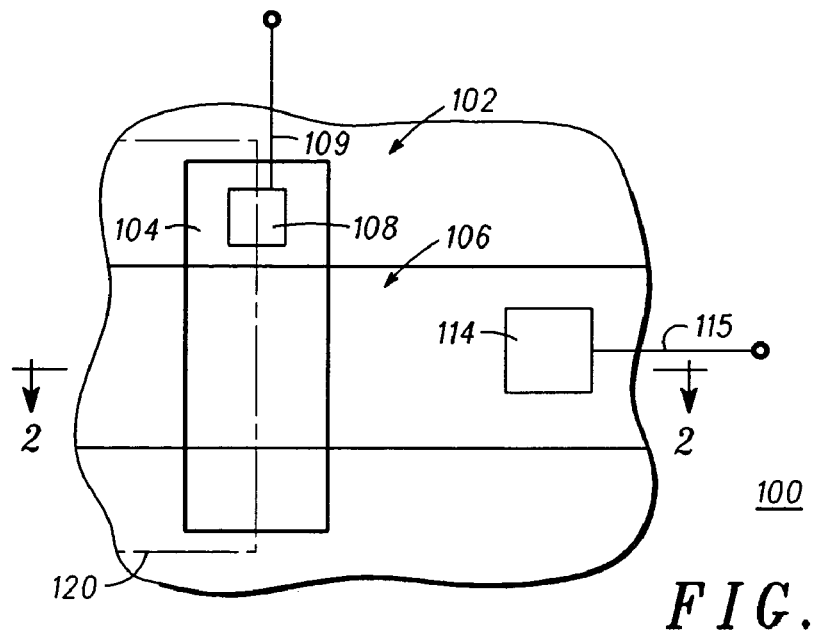
FIGS. 1-2 are a top schematic diagram and a cross-sectional schematic diagram of a tunable antifuse element in accordance with a first embodiment of the present invention.
Figure 2:
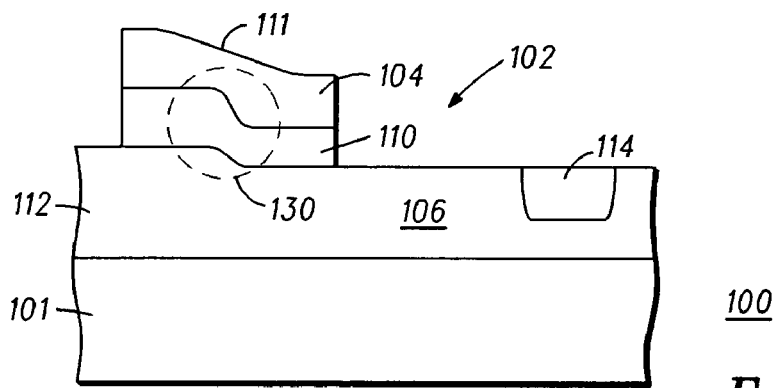

FIGS. 1-2 illustrate a top and a cross sectional view taken along line 2-2 of FIG. 1, of an embodiment of a tunable antifuse element according to the present invention. A semiconductor device 100, more particularly a tunable antifuse element 102, is formed as a unique gate capacitor comprising a gate material and an active area formed in a substrate material 101, shown in FIG. 2. Tunable antifuse element 102 may optionally be bounded by shallow trench isolation (STI) (not shown) when isolation of antifuse element 102 is required.

Substrate material 101 may be a standard semiconductor substrate such as bulk or epitaxial silicon wafer. Tunable antifuse element 102 is comprised of a top gate electrode 104 and an active area 106, that serves as a bottom electrode. The surface of active area 106 may include a heavily doped diffusion contact or a well contact 114 in the form of n-type or p-type implants to provide for good electrical contact.

Gate electrode 104 may be formed of polysilicon and serves as a top electrode for tunable antifuse element 102. For maximum density, gate electrode 104 can have a minimum width, usually submicron, and is formed proximate active area 106. In this preferred embodiment, gate electrode 104 is formed of a p-doped polysilicon material as is well known in the art and includes a contact 108 formed on an upper surface 111 thereof. A dielectric layer, also known as a gate oxide 110, as shown in FIG. 2, is formed between gate electrode 104 and active area 106. In a preferred embodiment, gate oxide 110 is a dielectric material, such as any material suitable for a dielectric or insulating layer. Gate electrode 104 is formed over gate oxide 110. As illustrated in this particular embodiment, antifuse element 102 is formed on an uppermost surface of substrate 101. Anticipated by this disclosure is the fabrication of antifuse element 102 on a sidewall of substrate 101 such as when fabricating a dual gate metal oxide field effect transistor (MOSFET) wherein the channel and gate oxide are formed on a sidewall of a silicon mesa. Accordingly, this disclosure is not limited to fabrication of the tunable antifuse element on an uppermost surface of a substrate, but includes fabrication on any surface of a silicon substrate.

FIG. 2 illustrates tunable antifuse element 102 including a doped pwell 112, also shown in FIG. 1, formed in a surface of substrate material 101, to have the same doping type as p-doped gate electrode 104. In an alternative, tunable antifuse element 102 may include a doped nwell 112, when gate electrode 104 is n-doped. A diffusion contact or well contact 114, in conjunction with an associated terminal 115, serves as a contact to pwell 112 and can be formed proximate a rupture region (discussed below) of overlying gate oxide 110. In addition, well contact 114 may act as a combination well contact and minority carrier injector. Anticipated by this disclosure is any combination of gate and well doping, including but not limited to a device including a doped pwell and p-doped gate electrode, or a doped pwell and n-doped gate electrode, or a doped nwell and p-doped gate electrode.

Referring again to FIG. 1, in one embodiment, device 100 is a CMOS capacitor that functions as an antifuse by becoming conductive after undergoing programming. Prior to any programming event, wherein a voltage is applied between contacts 108 and 114, via a terminal 109 and terminal 115 respectively, the path between gate contact 108 and diffusion or well contact 114 is an open circuit. Generally, the programming voltage is a voltage that is equal to or above the rupture voltage that causes tunable antifuse element 102 to change from an open state to a closed state, by causing a rupture (i.e. a breakdown of gate oxide 110 between gate electrode 104 and active area 106). During programming of tunable antifuse element 102, a programming voltage is applied between gate electrode 104 and the active area, or bottom electrode, 106. The programming event creates a vertical current path between gate electrode 104 and active area 106, the bottom electrode. Rupture, or breakdown, of gate oxide 110, formed there between, will occur at a rupture region 130 where the electric field is the highest. During programming, the highest electric fields will occur at a stepped portion (discussed below) of gate oxide 110 below gate electrode 104 that overlies or is positioned proximate active region 106.

Figure 3:
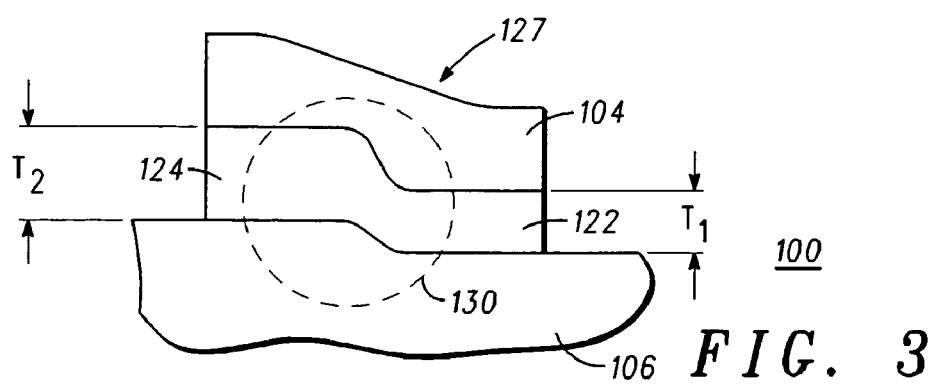
FIG. 3 is a cross-sectional schematic diagram of a tunable gate oxide in accordance with a first embodiment of the present invention.

During the fabrication of tunable antifuse element 102, a dual gate oxide (DGO) mask, illustrated by dashed line 120 in FIG. 1 and described in detail below, allows for the fabrication of tunable gate oxide 110. The term "dual gate oxide" is defined as gate oxide or dielectric having two or more thicknesses. In this particular embodiment, during fabrication, DGO mask layer 120 covers a left portion of semiconductor device 100. Referring now to FIG. 3, as a result of the DGO process (described below), gate oxide 110 is described as including a stepped structure 127, comprised of a thin oxide portion 122 having a thickness ($T_1$) and a thick oxide portion 124 having a thickness ($T_2$), formed under gate electrode 104, wherein $T_1$ is less than $T_2$. Gate oxide 110 will be stepped along an edge of DGO mask 120 that overlies gate oxide 110. During antifuse programming, the highest electric field is generated along stepped structure 127. The localization of the electric field promotes the gate rupture process at rupture point or region 130 using a low program voltage, energy, and time.

Figure 4:
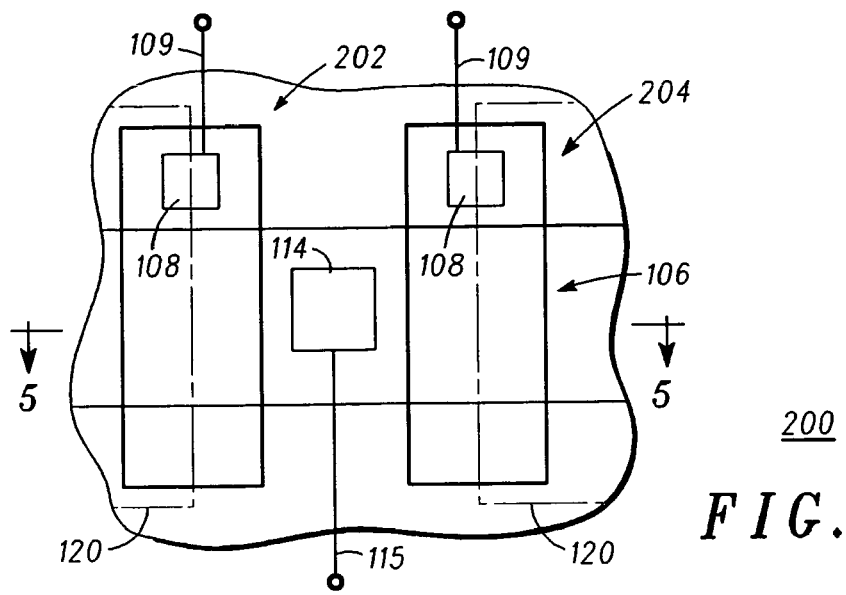
FIGS. 4-5 are a top schematic diagram and a cross-sectional schematic diagram of a tunable antifuse element in accordance with a second embodiment of the present invention.
Figure 5:
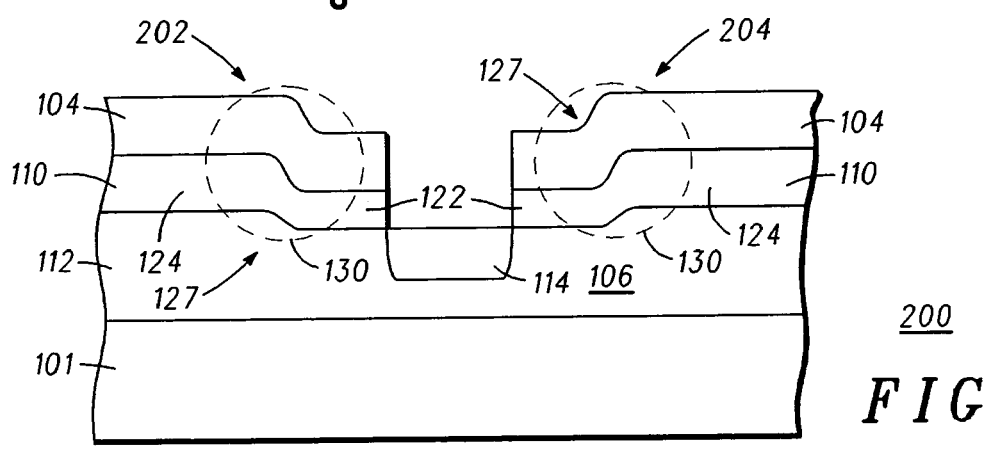

FIGS. 4-5 are a top view and a cross sectional view taken along line 5-5 of FIG. 4 of another embodiment of a tunable antifuse element according to the present invention. A semiconductor device 200, more particularly a plurality of tunable antifuse elements 202 and 204, are formed as unique gate capacitors comprising gate materials and an active area 106 formed in a substrate material 101. Antifuse elements 202 and 204 may optionally be bounded by shallow trench isolation (STI) (not shown). Antifuse elements 202 and 204 are formed similar to tunable antifuse element 100 of FIGS. 1-3 having like numerals to indicate like elements. Not all elements in FIGS. 4-5 that are similar to elements in FIGS. 1-3 will be described.

In this particular embodiment, device 200 includes two antifuse elements 202 and 204 formed side-by-side on a single substrate 101. Tunable antifuse elements 202 and 204 share active area 106 and contact well 114. During programming, the highest electric fields will occur in a stepped portion of gate oxide 110 (described below) of each element 202 and 204 below gate electrodes 104.

Similar to the embodiment described with regard to FIGS. 1-3, during the fabrication of tunable antifuse elements 202 and 204, a dual gate oxide (DGO) mask layer, illustrated by dashed line 120 in FIG. 4, covers a portion of antifuse elements 202 and 204. Tunable gate oxides 110 are formed of dual dielectric thicknesses, and described as each including a stepped structure 127 comprised of a thin oxide portion 122 and a thick oxide portion 124. Tunable gate oxide 110 will have a stepped structure along an edge of the DGO mask that overlies gate oxide 110 during fabrication. During antifuse programming, the highest electric field is generated at rupture points or regions 130 of each tunable antifuse element 202 and 204. The localization of the electric field promotes the gate oxide rupture process at rupture points or regions 130 using a low program voltage, energy, and time.

Figure 6:
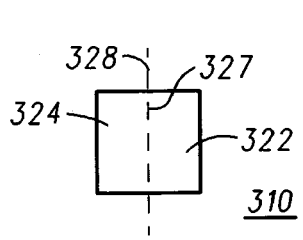
FIGS. 6-11 are top schematic diagrams showing various geometries of the tunable gate oxide in accordance with the present invention.

FIGS. 6-11 are examples of top schematic diagrams of a plurality of gate oxide geometries in accordance with a tunable antifuse element of the present invention. The shape and dimensions of tunable gate oxide 110 are chosen to produce a specific breakdown voltage with the given oxide thicknesses and etch profiles. It should be understood that in FIGS. 6-11, the specific thick and thin portions can be interchangeable to form additional gate oxide geometries. Gate oxide 110 is formed using DGO mask 120 and is described as tunable dependent upon the geometry of gate oxide 110 and the comparative thickness of the oxide layers that form the geometries. FIG. 6 illustrates the most typical geometry for a tunable gate oxide according to the present invention. More specifically, FIG. 6 illustrates a gate oxide 310, generally similar to gate oxide 110 of FIGS. 1-3, including a stepped structure 327 comprised of a thick oxide portion 324 and a thin oxide portion 322. A transition area 328 is formed where thick oxide portion 324 and thin oxide portion 322 intersect.

Gate oxide 310 has a rupture region located along transition area 328 where the electric field is most enhanced.

Figure 7:
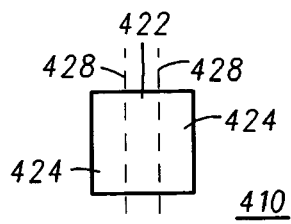

FIG. 7 illustrates another geometry for a tunable gate oxide according to the present invention. More specifically, FIG. 7 illustrates a gate oxide 410, generally similar to gate oxide 110 of FIGS. 1-3, including a stepped structure comprised of a plurality of thick oxide portions 424, having a thin oxide portion 422 sandwiched between. Dual transition areas 428 are formed where thick oxide portions 424 intersect with thin oxide portion 422. Gate oxide 410 has a rupture region located along transition areas 428 where the electric field is most enhanced.

Figure 8:
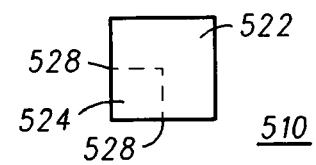

FIG. 8 illustrates another geometry for a tunable gate oxide according to the present invention. More specifically, FIG. 8 illustrates a gate oxide 510, generally similar to gate oxide 110 of FIGS. 1-3, including a stepped structure comprised of a thick oxide portion 524, having a thin oxide portion 522 formed to surround thick oxide portion 524 on at least two sides. A transition area 528 is formed where thick oxide portion 524 and thin oxide portion 522 intersect. Gate oxide 510 has a rupture region located along transition area 528 where the electric field is most enhanced.

Figure 9:
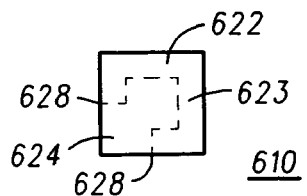

FIG. 9 illustrates another geometry for a tunable gate oxide according to the present invention. More specifically, FIG. 9 illustrates a gate oxide 610, generally similar to gate oxide 110 of FIGS. 1-3, including a stepped structure comprised of a thick oxide portion 624 and a thin oxide portion 622. A plurality of transition areas 628 are formed where oxide portion 624 and thin oxide portion 622 intersect. Gate oxide 610 has a rupture region located along transition areas 628 where the electric field is most enhanced.

Figure 10:
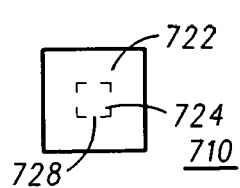

FIG. 10 illustrates another geometry for a tunable gate oxide according to the present invention. More specifically, FIG. 10 illustrates a gate oxide 710, generally similar to gate oxide 110 of FIGS. 1-3, including a stepped structure comprised of a thick oxide portion 724 and a thin oxide portion 722. This particular geometry of gate oxide 710 has thick oxide portion 724 completely surrounded by a thinner gate oxide, more particularly thin oxide portion 722. A transition area 728 is formed where thick oxide portion 724 and thin oxide portion 722 intersect. Gate oxide 710 has a rupture region located along transition area 728 where the electric field is most enhanced.

Figure 11:
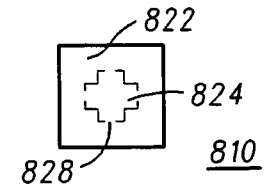
Figure 12:
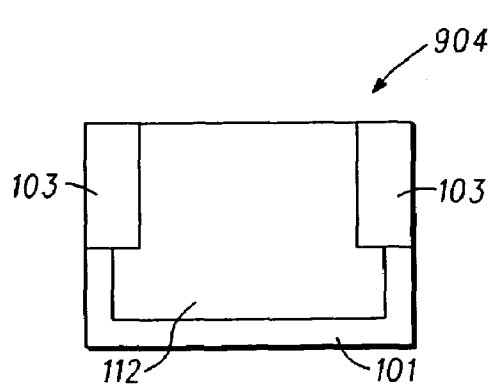
FIGS. 12-19 are cross-sectional schematic diagrams of a method of fabricating a tunable antifuse element according to the present invention.

FIG. 11 illustrates another geometry for a tunable gate oxide according to the present invention. More specifically, FIG. 11 illustrates a gate oxide 810, generally similar to gate oxide 110 of FIGS. 1-3, including a stepped structure comprised of a thick oxide portion 824 and a thin oxide portion 822. This particular geometry of gate oxide 810 has thick oxide portion 824 completely surrounded by a thinner gate oxide, more particularly thin oxide portion 822 in a similar manner as gate geometry 710 shown in FIG. 10. In this particular geometry, thick oxide portion 824 is formed having a cross shape to promote formation of rupture points or a rupture region. A transition area 828 is formed where thick oxide portion 824 and thin oxide portion 822 intersect. Gate oxide 810 has a rupture region located along transition area 824 where the electric field is most enhanced.

FIGS. 12-19 are cross-sectional schematic diagrams of a method of fabricating a tunable antifuse element according to the present invention. More specifically, FIGS. 12-19 illustrate a method of fabricating a tunable antifuse element including a tunable gate oxide having a geometry as described in FIG. 10. It should be understood that the method described and illustrated in FIGS. 12-19 could also be used to fabricate a tunable antifuse element similar to the tunable antifuse elements described with respect to FIGS. 1-5, or having any gate oxide geometry such as those described in FIGS. 6-9 and 11. In general, the tunable antifuse element of the present invention uses conventional DGO processes to create a tunable gate oxide comprised of a plurality of dielectric thicknesses and varying geometries.

FIGS. 12-19 illustrate the fabrication steps of a tunable antifuse element 904. The process steps are offered by way of example as one method for reduction to practice of conceived embodiments. Other methods are anticipated as would be obvious to one skilled in the art, and the scope of this description is not intended to be limited to this general process description. A substrate 101 is provided having a pwell 112 formed therein. Substrate material 101 may be a standard semiconductor substrate such-as bulk or epitaxial silicon substrate and is intended to encompass the relatively pure silicon materials typically used in the semiconductor industry, silicon-on-insulator, as well as silicon compound semiconductors, such as silicon germanium and the like. Metals and other conductive materials may be considered when forming metal-insulator-metal (MIM) capacitor. In addition, other suitable substrates, such as substrates including III-V materials and II-VI materials may also be considered in specific instances depending on device requirements. Pwell 112 is formed by ion implantation of boron or other means to a concentration of between $\sim 1\times 10^{14}/cm^3$ and $\sim 5\times 10^{17}/cm^3$. If required, shallow trench isolation (STI) 103 is next formed by conventional etch and refill methods. STI 103 provides separation between tunable antifuse element 904 and any devices proximate antifuse element 904.

Figure 13:
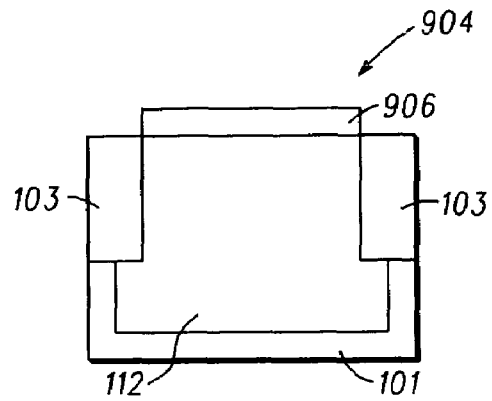
Figure 14:
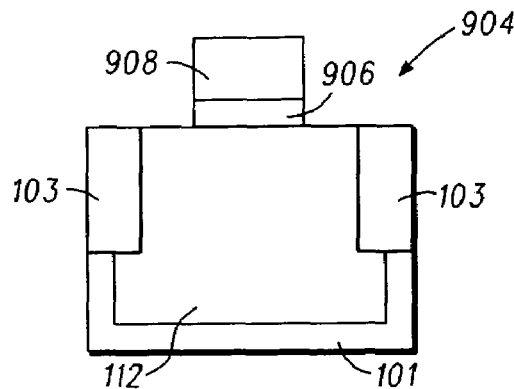

Referring now to FIG. 13, subsequent to the formation of STIs 103 and Pwells 112, a thick insulating layer 906 is formed over the entire substrate 101. Thick insulating layer 906 is typically formed of silicon nitride, silicon oxide, a high K dielectric, or other similar insulating material. Thick insulating layer 906 is next patterned using a mask layer 908 as illustrated in FIG. 14, such as a DGO mask, such that a portion of thick insulating layer 906 formed on an active area of tunable antifuse element 904, similar to active area 106 of tunable antifuse element 102 (FIG. 10) is etched way. Next, mask layer 908 is removed.

Figure 15:
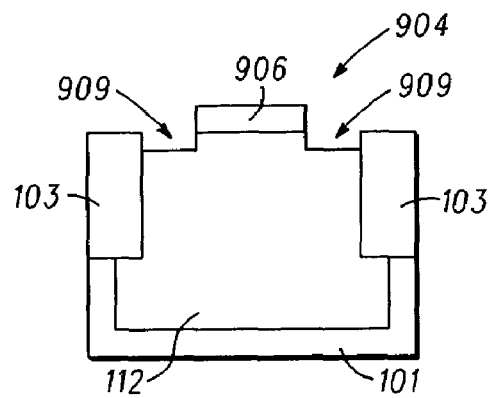
Figure 16:
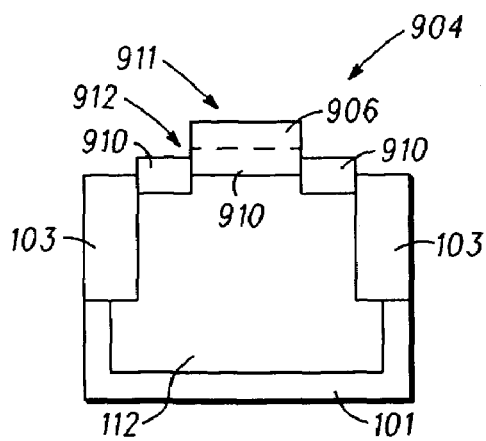

FIG. 15 illustrates the possible subtraction of a portion 909 of substrate 101 due to over-etch when substrate 101 undergoes undesirable silicon loss due to the etch step to remove thick insulating layer 906. FIG. 16 illustrates a thin oxide layer 910 that is next grown over the active area of tunable antifuse element 904. Layer of thin oxide 910 that is grown directly on substrate 101 in portions 909 will grow at a faster speed than layer of thin oxide 910 that is grown in an active area of tunable antifuse element 904 where growth is over thick oxide layer 906. However, the resulting layers 910 formed in portions 909 will remain thinner than the combination layer grown in areas covered by thick oxide layer 906. Growth of thin oxide layer 910 may be accomplished by using standard deposition techniques in which thin oxide layer 910 will grow on a surface of thick oxide layer 906, or by using thermal oxidation techniques in which thin oxide layer 910 actually grows underneath layer 906 as illustrated in FIG. 16. The resultant dual oxide layers in active area 106 of tunable antifuse element 904 serve as a stepped tunable gate oxide comprising a geometry similar to that described in FIG. 10. More specifically, a single thin oxide layer 910 surrounds a central portion 911, comprised of thick oxide layer 906 formed on top of thin oxide layer 910. Gate oxide 110 has a stepped structure 912 defined by thin oxide layer 910 and thick oxide layer 906 as shown in FIG. 16.

Figure 17:
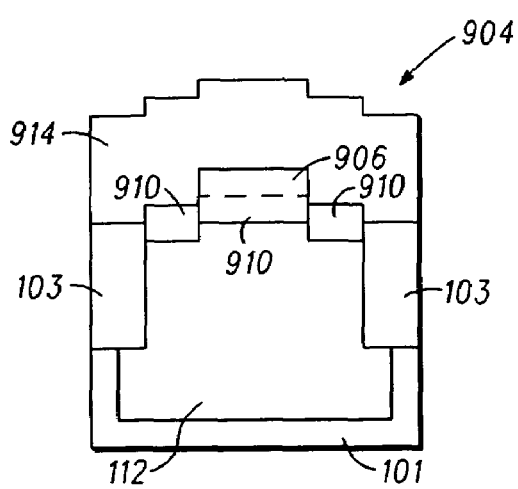
Figure 18:
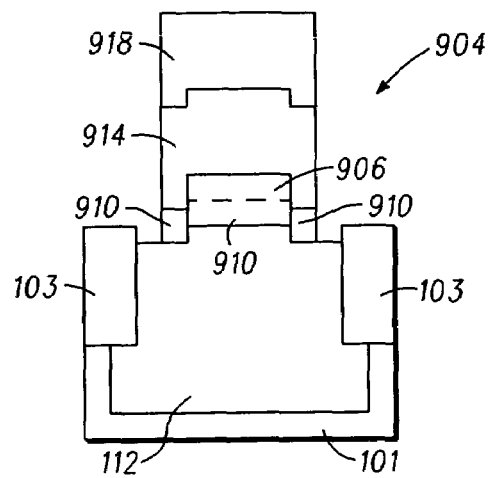
Figure 19:
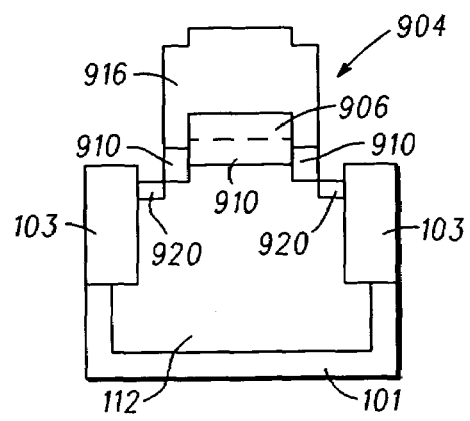

To complete the fabrication of tunable antifuse element 904, a layer of polysilicon 914 is deposited on the surface of the device as illustrated in FIG. 17. A mask layer 918 is next deposited providing for subsequent patterning and etching of polysilicon layer 914 and fabrication of gate 916 as illustrated in FIGS. 18 and 19. The formation of well contacts 920 by implantation follows, as illustrated in FIG. 19.

As stated previously tunable antifuse element 904 is fabricated in generally the same manner as a conventional antifuse element, except that additional photolithography and etch steps are performed during fabrication of tunable antifuse element 904 to provide for varying gate oxide thicknesses and geometries. The additional mask and wet etch step are actually part of standard CMOS process flow. Accordingly, the method described is most compatible with extant CMOS flows but other methods, such as an etchback, can also be used. In addition, one could design the structure to expose surfaces of two different crystallographic orientations and using the resulting natural differential rates of oxidation to make oxides of different thicknesses when grown thermally.

Figure 20:
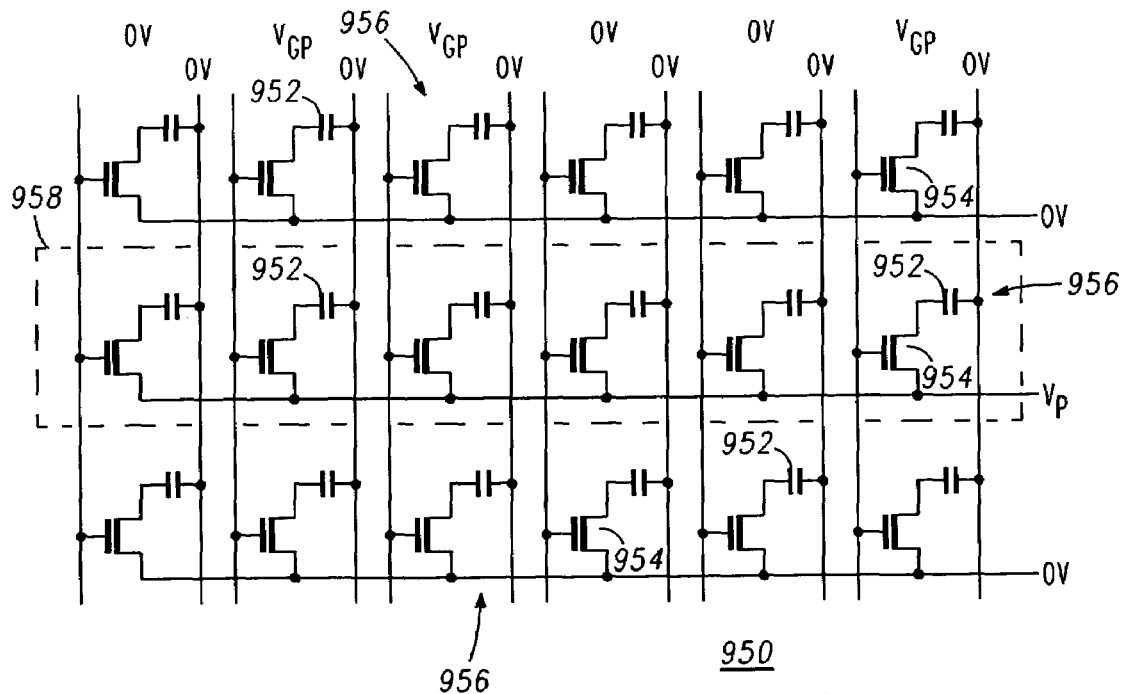
FIGS. 20-21 are schematic diagrams illustrating a bit cell array including a tunable antifuse element in accordance with the present invention.

FIG. 20 illustrates an antifuse array 950, including a plurality of antifuse elements 952, formed generally similar to tunable antifuse element 102 of FIGS. 1-3. Antifuse elements 952 are capacitors and may optionally be combined with a series select transistor 954 to form a plurality of bit cells 956. Antifuse array 950 is comprised of plurality of tunable antifuse elements 952 and a plurality of series select transistors 954 that in combination form plurality of bit cells 956. In the embodiment illustrated in FIG. 20, a sector 958, indicated by the dashed line, is being programmed. Once bit cells 956 are arranged to form array 950, the use of low PROGRAM and READ biases allows low voltage (LV) and dual gate oxide (DGO) transistors to be used as select transistors 954, and provide increased array density. Antifuse elements 952 have a dielectric breakdown that is below that of logic and DGO transistors. This low breakdown voltage allows for a high-density array and produces low cost per bit. Array 950 can be programmed one row at a time without PROGRAM DISTURB in unselected rows. During programming, only one row and certain select transistor 954 gates are at non-zero biases. The bits to be programmed experience a bias close to the programming voltage (Vp). Select gates protect the bits that are not being programmed in the selected rows.

Figure 21:
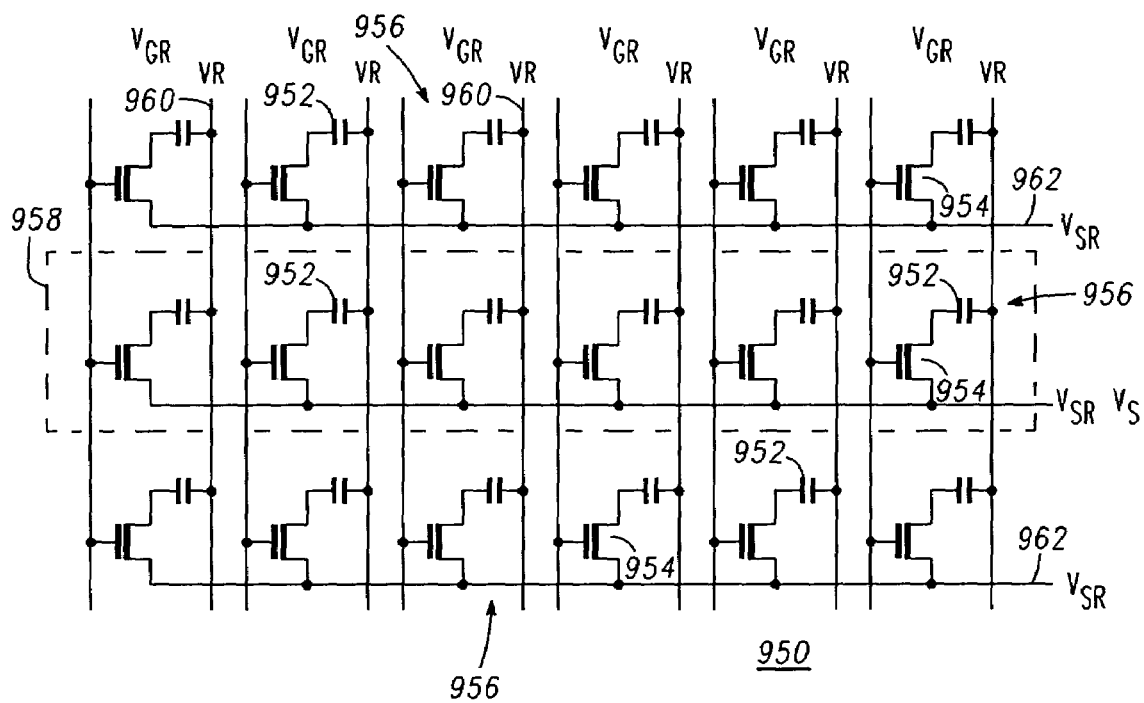

FIG. 21 illustrates reading of antifuse array 950 without READ DISTURB in unselected rows. In the embodiment illustrated, sector 958, indicated by the dashed line, is being read. In addition, READ bias polarity in antifuse elements 952 can be opposite to the PROGRAM bias polarity. Shorted bits connect their wordlines 960 and source lines 962, resulting in current flow on their word lines 960. Unprogrammed bit cells 956 do not experience significant conduction at these lower biases. The architecture of array 950 and operation allows reliability to be maintained over many READ cycles and allows for reverse polarity programming and readings, adding a degree of freedom to further optimize reliability. The creation of a larger bit-count antifuse array in a cost-effective manner, allows for applications such as: (i) security applications; (ii) IC customization by customer; (iii) IC customization by manufacturer; (iv) IC identification and tracking; (v) "black-box" writes; (vi) more extensive and distributed trim; (vii) storage of very small programs; and (viii) field programmability.

Accordingly, provided is a tunable antifuse element comprising: a substrate material; an active area formed in a surface of the substrate material; a gate electrode having at least a portion positioned above the active area; and a tunable dielectric layer including a stepped structure, the tunable dielectric layer disposed between the gate electrode and the active area such that a voltage between the gate electrode and the active area creates a current path through the tunable dielectric layer and a rupture of the tunable dielectric layer in a rupture region. In one embodiment, the tunable antifuse element is a capacitor. In one embodiment, the substrate material is a semiconductor material. The active area comprises an electrically conductive doped region. The tunable dielectric layer is a tunable gate oxide layer. In one embodiment, the tunable gate oxide layer is comprised of at least one thin oxide portion having a thickness $T_1$ and at least one thick oxide portion having a thickness $T_2$, wherein $T_1$ is less than $T_2$, the stepped structure defined by a thickness variation between the thin oxide portion and the thick oxide portion. The stepped structure includes a plurality of thick oxide portions and at least one thin oxide portion. The stepped structure includes a plurality of thin oxide portions and at least one thick oxide portion. The rupture region is located at a transition region between the at least one thick oxide portion and the at least one thin oxide portion.

In addition, provided is a method of fabricating a tunable antifuse element, the method comprising: providing a substrate material; forming an active area in a surface of the substrate material; forming a gate electrode having at least a portion positioned above the active area; and forming a tunable dielectric layer including a stepped structure, the tunable dielectric layer disposed between the gate electrode and the active area such that a voltage between the gate electrode and the active area creates a current path through the tunable dielectric layer and a rupture of the tunable dielectric layer at a rupture region. The step of forming a tunable dielectric layer includes forming at least one thick oxide portion having a thickness $T_2$ and at least one thin oxide portion having a thickness $T_1$, wherein $T_1$ is less than $T_2$. The at least one thick oxide portion and the at least one thin oxide portion of the tunable gate oxide layer are formed using a dual gate oxide mask. The step of forming a tunable dielectric layer includes forming a first insulating layer over the substrate material, etching away a portion of the first insulating layer to expose a portion of the substrate material, and forming a second insulating layer, wherein a portion of the second insulating layer is formed as one of over or under the first insulating layer and a portion is formed over the exposed portion of the substrate material, thereby defining the stepped gate oxide structure.

Finally, provided is a tunable antifuse array comprising: a plurality of bit cells, each of the plurality of bit cells comprising at least one tunable antifuse element, wherein each of the at least one tunable antifuse elements is comprised of: a substrate material; an active area formed in a surface of the substrate material; a gate electrode having at least a portion positioned above the active area; and a tunable dielectric layer including a stepped structure, the tunable dielectric layer disposed between the gate electrode and the active area such that a voltage between the gate electrode and the active area creates a current path through the tunable dielectric layer and a rupture of the tunable dielectric layer in a rupture region. In one embodiment, the tunable antifuse array further includes at least one select transistor. In one embodiment, the at least one tunable antifuse element is a capacitor. In one embodiment, the tunable dielectric layer is comprised of at least one thin oxide portion having a thickness $T_1$ and at least one thick oxide portion having a thickness $T_2$, wherein $T_1$ is less than $T_2$, a stepped structure defined by a thickness variation between the thin oxide portion and the thick oxide portion. In one embodiment, the stepped structure includes a plurality of thick oxide portions and at least one thin oxide portion. In one embodiment, the stepped structure includes a plurality of thin oxide portions and at least one thick oxide portion. The rupture region is located at a transition region between the at least one thick oxide portion and the at least one thin oxide portion.

While a plurality of exemplary embodiments have been presented in the foregoing detailed description, it should be appreciated that additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for forming an antifuse element, comprising:
determining a target breakdown voltage;
providing a substrate;
forming an active area within the substrate;
forming a first gate oxide layer on the active area;
applying a dual gate oxide (DGO) mask over a portion of the first gate oxide layer, thereby defining a DGO masked region;
etching away a portion of the gate oxide outside the DGO masked region and a portion of the substrate outside the DGO masked region such that the substrate has a first gradual step structure along an edge of the DGO masked region;
removing the DGO mask;
forming a second oxide layer over the first gradual step structure of the substrate and the first oxide layer to produce a combined oxide layer having a second gradual step structure over the first gradual step structure, wherein the first gradual step structure has a first slope, the second gradual step structure has a second slope, and the second slope has the same slope direction but a greater slope magnitude than the first slope;
forming a gate electrode over the combined oxide layer such that the combined oxide layer, gate electrode, and active area of the substrate form a rupture region having an actual breakdown voltage substantially equal to the target breakdown voltage.

2. The method of claim 1, wherein the active area comprises a heavily doped diffusion contact.

3. The method of claim 1, wherein the combined oxide layer has a submicron minimum thickness, and a maximum thickness that is greater than the minimum thickness.

4. The method of claim 1, wherein the gate electrode is formed from polysilicon.

5. The method of claim 1, wherein the DGO mask is applied in connection with formation of a dual gate metal oxide field effect transistor (MOSFET).

* * * * *